United States Patent
Doyle et al.

(10) Patent No.: US 8,434,222 B2
(45) Date of Patent: May 7, 2013

(54) METHOD TO MANUFACTURE A CIRCUIT APPARATUS HAVING A ROUNDED DIFFERENTIAL PAIR TRACE

(75) Inventors: Matthew S. Doyle, Rochester, MN (US); Joseph Kuczynski, Rochester, MN (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 12/870,072

(22) Filed: Aug. 27, 2010

(65) Prior Publication Data
US 2012/0048600 A1    Mar. 1, 2012

(51) Int. Cl.
*H05K 3/02* (2006.01)
*H05K 3/10* (2006.01)

(52) U.S. Cl.
USPC ................................ 29/846; 29/830; 174/261

(58) Field of Classification Search .................... 29/828, 29/830, 846, 851, 852; 174/261, 262; 361/792; 333/4; 438/263
See application file for complete search history.

(56) References Cited

U.S. PATENT DOCUMENTS

| | | | | |
|---|---|---|---|---|
| 3,499,219 A | * | 3/1970 | Griff et al. | 29/828 |
| 7,061,342 B2 | * | 6/2006 | Brunker et al. | 333/4 |
| 7,615,817 B2 | * | 11/2009 | Moon et al. | 438/263 |

* cited by examiner

Primary Examiner — Donghai D. Nguyen
(74) Attorney, Agent, or Firm — Owen J. Gamon

(57) ABSTRACT

A first artwork layer having a first adaptable-mask section allows a graded amount of light to pass into an underlying first photoresist layer. Subsequent to developing the first photoresist layer, the graded amount of light creates a rounded geometric void used as a mold or sidewall for the creation of at least a lower portion of a rounded trace. A dielectric layer is laminated upon the lower portion and a second artwork layer having an second adaptable-mask section allows a graded amount of light to pass into a second photoresist layer. Subsequent to developing the second photoresist layer, the graded amount of light creates a rounded geometric void used as a mold or sidewall for the creation of at least an upper portion of a rounded trace. The photoresist and dielectric layers are removed resulting in a circuit apparatus having a rounded differential pair trace.

11 Claims, 6 Drawing Sheets

METHOD TO MANUFACTURE A CIRCUIT APPARATUS HAVING A ROUNDED DIFFERENTIAL PAIR TRACE

CROSS REFERENCE TO RELATED APPLICATIONS

The present application is related to commonly owned co-pending application filed herewith having Ser. No. 12/870,041, entitled, "CIRCUIT APPARATUS HAVING A ROUNDED TRACE".

BACKGROUND OF THE INVENTION

1. Field of the Invention

Embodiments of this invention relate generally to electronic systems and more specifically relate to a circuit apparatus having an electrically conductive trace, methods of manufacturing the circuit apparatus, and design structures used in the design, manufacturing, and/or test of the circuit apparatus.

2. Description of the Related Art

A printed circuit board (PCB), flex circuit, or the like are used to mechanically support and electrically connect electronic components using conductive pathways, or traces.

PCBs consist of various insulating dielectric layers that may be laminated together with epoxy or equivalent material. A variety of different dielectrics that can be chosen to provide different insulating values depending on the requirements of the circuit. Some of these dielectrics are polytetrafluoroethylene, FR-4, FR-1, CEM-1, CEM-3, polyimide, etc. Well known epoxy materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester).

Some PCB traces are made by bonding a layer of copper over a large area of the substrate, sometimes on both sides of the substrate, then removing unwanted copper after applying a temporary mask (e.g. by etching), leaving only the desired copper traces. Other PCB traces are made by adding traces to the bare substrate or a substrate with a very thin layer of copper usually by a process of multiple electroplating steps.

SUMMARY OF THE INVENTION

In various embodiments of the present invention a circuit apparatus having a rounded differential pair trace, a method to manufacture the circuit apparatus, and a design structure used in the design, testing, or manufacturing of the circuit apparatus are described.

In an embodiment a method to manufacture a circuit apparatus having a rounded differential pair trace includes creating a first portion of a rounded electrically conductive trace having a first rounded sidewall and a first flat sidewall; applying a dielectric layer upon the flat sidewall; and creating a second portion of the rounded electrically conductive trace having a second rounded sidewall and a second flat sidewall. In other embodiments the first rounded sidewall and the second rounded side wall are aligned together forming a circle or ellipse.

In another embodiment creating the first portion of a rounded electrically conductive trace having the first rounded sidewall and the first flat sidewall further includes applying a first photoresist layer to a substrate; registering a first artwork layer having at least one adaptable-mask section and at least one continuous-mask section upon the first photoresist layer; and developing the first photoresist layer creating a void in the photoresist layer.

In yet other embodiments creating the first portion of the rounded electrically conductive trace having the first rounded sidewall and the first flat sidewall further includes applying an electroplating seed layer within a void created in the developed first photoresist layer or plating an electrically conductive material within the void created in the developed first photoresist layer. In another embodiment applying the dielectric layer upon the flat sidewall further includes laminating a dielectric layer upon the developed first photoresist layer and electrically conductive plated surface.

In yet another embodiment creating the second portion of the rounded electrically conductive trace having the second rounded sidewall and the second flat sidewall further includes applying a second photoresist layer upon the dielectric layer; registering a second artwork layer having at least one adaptable-mask section and at least one continuous-mask section layer upon the second photoresist layer; and developing the second photoresist layer.

In still another embodiment creating the second portion of a rounded electrically conductive trace having the second rounded sidewall and the second flat sidewall further includes applying an electroplating seed layer within a void created in the developed second photoresist layer or plating an electrically conductive material within the void created in the developed second photoresist layer.

In still another embodiment a circuit apparatus having a rounded electrically conductive trace includes a dielectric layer; a lower portion of the rounded electrically conductive trace having a first rounded sidewall and a first flat sidewall, the lower portion of the electrically conductive trace joined to the dielectric layer; and an upper portion of the rounded electrically conductive trace having a second rounded sidewall and a second flat sidewall, the lower portion of the electrically conductive trace joined to an opposing side of the dielectric layer. In another embodiment the first rounded sidewall and the second rounded side wall are aligned together to form a circular or elliptical geometry.

In yet another embodiment the circuit apparatus also includes a first photoresist layer having a geometrical void used to create the lower portion of the rounded electrically conductive trace and/or a second photoresist layer having a geometrical void used to create the lower portion of the rounded electrically conductive trace. In still another embodiment the first photoresist layer has an opposite tone relative to the second photoresist layer.

In another embodiment a design structure embodied in a machine readable medium for designing, manufacturing, or testing of a circuit apparatus, includes a functional representation of one or more of those features of the circuit apparatus.

These and other features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
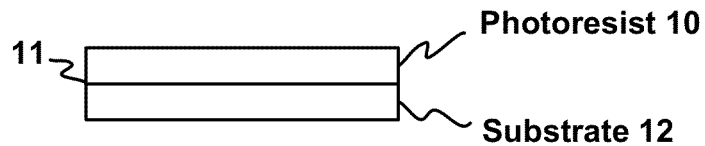
FIGS. 1-11 depicts a cross-section of a circuit apparatus during various manufacturing stages according to embodiments of the present invention.

For a better understanding of the various embodiments of the present invention, together with other and further features and advantages thereof, reference is made to the following description, taken in conjunction with the accompanying drawings, and the scope of the invention asserted in the claims.

It will be readily understood that the components of the present invention, as generally described and illustrated in the Figures herein, may be arranged and predetermined in a wide variety of different configurations. Thus, the following more detailed description of the embodiments of the circuits, design structure, and methods of the present invention, as represented in FIGS. 1-16, are not intended to limit the scope of the invention, as claimed, but is merely representative of selected exemplary embodiments of the invention.

As will be appreciated by one skilled in the art, various embodiments of the present invention may be embodied as a system, apparatus, method, design structure, computer program product or a combination thereof. Accordingly, embodiments of the present invention may take the form of an entirely hardware embodiment, an entirely software embodiment (including firmware, resident software, micro-code, etc.), or an embodiment combining software and hardware aspects that may all generally be referred to, for example as a "circuit," "module" or "system." Furthermore, embodiments of the present invention may take the form of a computer program product embodied in any tangible medium of expression having computer usable program code embodied in the medium.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. In addition, features described in connection with a particular embodiment may be combined or excluded from other embodiments described herein.

Embodiments of the present invention are described below with reference to flowchart illustrations and/or block diagrams of methods, apparatuses, design structures, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, a magnetic or other such storage device, or a design process system utilized in the design, manufacturing, and or testing of an electronic component or system.

In some alternative implementations, the functions noted in the block may occur out of the order noted in the figures. For example, two blocks shown in succession may, in fact, be executed concurrently, or the blocks may sometimes be executed in the reverse order, depending upon the functionality involved.

Design structures used in the design, manufacturing, or testing of a circuit apparatus having rounded traces described herein may be utilized to distribute a representation of the circuit apparatus to a computer system. The distribution may be on a distribution medium such as floppy disk or CD-ROM or may be on over a network such as the Internet using FTP, HTTP, or other suitable protocols. From there, the representation of the circuit apparatus is copied to a hard disk or a similar intermediate storage medium and later utilized in the design, manufacturing, or testing.

FIG. 1 depicts a cross-section of a circuit apparatus during a photoresist application manufacturing stage according to an embodiment of the present invention. A photoresist layer 10 is applied upon, laminated, or otherwise joined to a substrate 12. In certain embodiments, photoresist layer 10 may be temporarily joined to substrate 12 (e.g. the photoresist layer 10 may be applied as a dry film or liquid, etc.). Substrate 12 may be a flexible laminate or rigid laminate depending on the application of the desired circuit and may be made from various dielectric material(s), such as, polytetrafluoroethylene, FR-4, FR-1, CEM-1, CEM-3, polyimide, or other equivalent material(s).

Photoresist layer 10 is sensitive to light, and in certain embodiments may be sensitive to ultraviolet light, deep ultraviolet light, the H and I lines of a mercury-vapor lamp, etc. When exposed to light, or otherwise developed, those exposed sections of photoresist layer 10 become soluble or insoluble depending upon whether photoresist layer 10 is a positive tone photoresist or a negative tone photoresist. The height of photoresist layer 10 is related to the desired height of the trace. More specifically, the height of photoresist layer 10 plus half of the height of dielectric layer 41, further described below, is approximately half the height of the desired trace.

A positive tone photoresist is a type of photoresist in which the portion of the photoresist that is exposed to light becomes soluble to a photoresist developer. The portion of the positive tone photoresist that is unexposed remains insoluble to the photoresist developer that may be later used to dissolve the exposed portion of the positive tone photoresist. A negative tone resist is a type of photoresist in which the portion of the photoresist that is exposed to light becomes relatively insoluble to the photoresist developer. Likewise, in a post process the soluble or unexposed portion of the negative tone photoresist may be dissolved by a photoresist stripper.

A first example is herein recited describing various manufacturing stages where photoresist layer 10 is a positive tone photoresist, though in other applications photoresist layer 10 may be a negative tone photoresist. This first example is carried forward in subsequent manufacturing stages documented in this detailed description.

Figure 2:
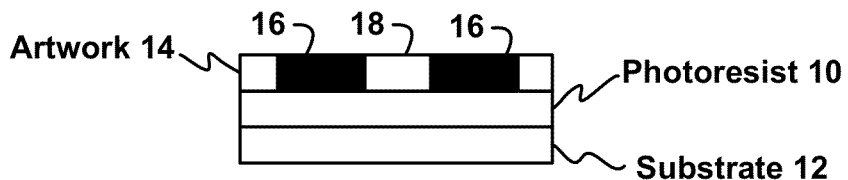

FIG. 2 depicts a cross-section of a circuit apparatus during an artwork registration manufacturing stage according to embodiments of the present invention. Artwork 14 is applied upon, registered, or otherwise joined to the circuit apparatus of FIG. 1. For example artwork 14 may be a glass master that is registered via fiducials and pinned in place directly over the photoresist layer 10. A vacuum is optionally drawn over the glass master/photoresist layer 10 to eliminate air and ensure intimate contact. Artwork 14 has one or more adaptable-mask sections 16 and one or more continuous-mask sections 18. Adaptable-mask section 16 allows a graded, attenuated, decreasing, increasing, or otherwise user defined amount of light to pass through the adaptable-mask section 16, across the length of section 16. Continuous-mask section 18 allows a similar or otherwise constant amount of light to pass through the continuous-mask section 18 across the length of section 18. Typically continuous-mask section 18 allows either approximately all of the light or approximately none of the light to pass through the section 18.

The density of adaptable-mask section 16 is graded, attenuated, less or more dense, or is otherwise user defined across the length of section 16 to allow for a predetermined varying amount of light to pass through adaptable-mask section 16. Therefore, when light is exposed to the circuit apparatus of FIG. 2, a predetermined varying amount of light may penetrate photoresist layer 10 creating a soluble section and insoluble section in photoresist layer 10 beneath the adaptable-mask section 16. Adaptable-section 16 and the soluble and insoluble photoresist sections are further described with reference to FIG. 13 below.

Depending if photoresist layer 10 is a positive tone or a negative tone photoresist, continuous-mask section 18 is transparent or nearly transparent or is opaque or nearly opaque. For example if photoresist layer 10 is a positive tone photoresist, continuous-mask section 18 is sufficiently opaque and blocks light from passing through to photoresist layer 10. If photoresist 10 is a negative tone photoresist, continuous-section 18 is sufficiently transparent and allows light to pass through to photoresist layer 10.

In the first example adaptable-mask section 16 is sufficiently opaque at a first edge, gradually becomes more transparent becoming sufficiently transparent, and gradually becomes more and more opaque becoming sufficiently opaque at a second edge. Also in the first example, continuous-section 18 is sufficiently opaque. Consequently, no light penetrates the location of photoresist 10 beneath the first and second edges of adaptable-mask section 16 and beneath the continuous-section(s) 18. The largest amount of light penetrates the location of photoresist 10 beneath the sufficiently transparent location of adaptable-mask section 16.

Figure 3:
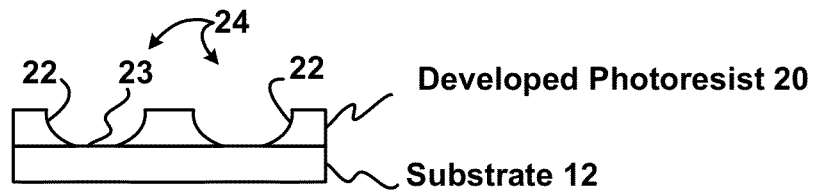

FIG. 3 depicts a cross-section of a circuit apparatus during a photoresist develop manufacturing stage according to embodiments of the present invention. The circuit apparatus of FIG. 2 is exposed to light allowing those sections of photoresist 10 beneath adaptable-mask section 16 and/or those sections beneath continuous-mask section 18 being exposed to light resulting in the soluble section and the insoluble section of photoresist layer 10. Subsequently the soluble section(s) may be removed, or otherwise developed, by a photoresist developer. After removal of the soluble section(s), photoresist layer 10 becomes developed photoresist layer 20 and the circuit apparatus of FIG. 2 becomes the circuit apparatus of FIG. 3.

Upon removal of the soluble section(s), developed photoresist layer 20 has one or more resulting geometric voids 24 used later as a side wall or mold to create at least a portion of a trace. Within each geometric void 24 there exists an area of exposed substrate 23. Exposed substrate 23 is a sufficiently large interface between the trace and the substrate 12 and exists so that the trace may be sufficiently bonded, or otherwise attached, to substrate 12. Please note that a sufficiently large interface may in fact be quite small, thus allowing for a small area of exposed substrate 23.

In the first example, the geometric voids 24 take the form of one or more concave wells 22. Concave wells 22 may be elliptical, circular, or an equivalent shape used to form a rounded, arced, concave, or otherwise curved trace sidewall. In the present first example concave well 22 is the shape of the lower half of an ellipse or circle. Depending upon the desired geometry of the trace, however, there may be one or more straight segments within the arced or curved side walls. In some embodiments, the bottom of the concave well 22 is coincident to substrate 12, where thus a small area of exposed substrate 23 exists. In other embodiments a larger area of exposed substrate 23 exists at the bottom of concave well 22.

Figure 4:
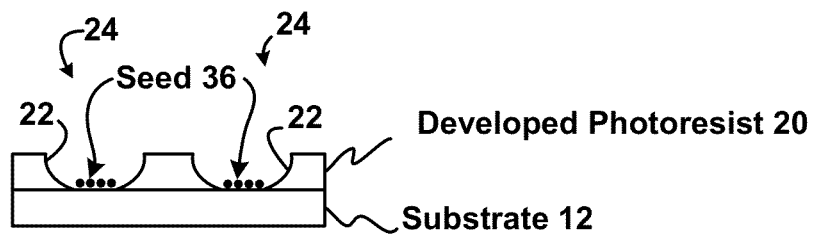

FIG. 4 depicts a cross-section of a circuit apparatus during a seed application stage according to embodiments of the present invention. During the seed application stage an electroplating seed layer 36 is applied upon the circuit apparatus of FIG. 3. Specifically the electroplating seed layer 36 may be applied upon substrate 12 within, for example, geometric void 24. The electroplating seed layer 36 may comprise an adhesion layer and a plating-seed layer. The adhesion layer provides a more effective bonding surface for the plating-seed layer to bond with substrate 12. The plating-seed layer may be for example photolithographically patterned within, and the length of, geometric void 24, generally defining the pattern of the desired electrically conductive trace(s). Alternatively, the seed 36 may inherently possess a natural adhesion to substrate 12. The plating-seed layer may be a gold plating seed, hard gold plating seed, copper plating seed, palladium based seed, etc. The plating-seed layer facilitates electroplating deposition of electrically conductive traces on substrate 12 further described below.

Figure 5:
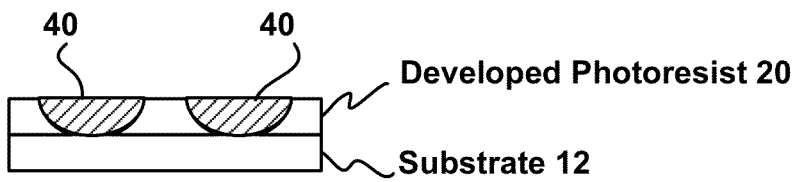

FIG. 5 depicts a cross-section of a circuit apparatus during a plating stage according to embodiments of the present invention. During the plating stage a portion 40 of a trace is developed upon the circuit apparatus of FIG. 4. In an exemplary plating stage the circuit apparatus of FIG. 4 and the desired material used to create the trace (e.g. gold, hard gold, copper, etc.) are immersed in a electrolyte solution containing one or more dissolved metal salts as well as other ions that permit the flow of electricity. A rectifier supplies a direct current to the trace material, oxidizing the metal atoms that comprise it, allowing them to dissolve in the solution. The dissolved metal ions in the electrolyte solution are reduced at the interface between the solution and the seed layer 36, such that they plate onto the seed layer 36. A second plating stage may be used to, for example, create a gold-pated copper trace. Subsequent to plating the trace material fills the side walls or mold created by geometrical voids 24. In the first example since concave well 22 is rounded, a portion 40 of a rounded trace(s) are created. The top surface of portion 40 may be on a similar plane to the top surface of developed photoresist 20. A post process polish may therefore be required to create a relatively flat surface across portion 40 and developed photoresist 20.

Figure 6:
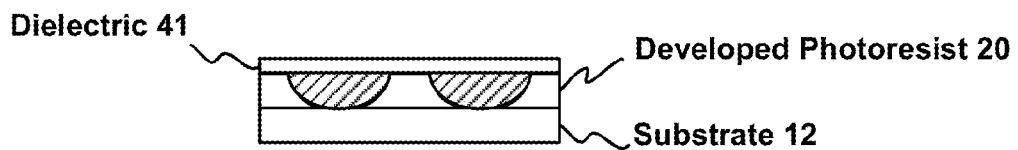

FIG. 6 depicts a cross-section of a circuit apparatus during a dielectric layer application stage according to an embodiment of the present invention. During the dielectric stage a dielectric layer 41 is applied upon, laminated, or otherwise joined to the circuit apparatus of FIG. 5. In certain embodiments, dielectric layer 10 is joined to the circuit apparatus of FIG. 5 using various adhesives (e.g. epoxies, acrylics, pressure sensitive adhesives, etc.) or may be applied as a dry film. Dielectric layer 41 may be made from various dielectric material(s), such as, polytetrafluoroethylene, FR-4, FR-1, CEM-1, CEM-3, polyimide, or the equivalent. At least a portion of dielectric layer 41 is eventually utilized as a functional element of the final circuit apparatus to electrically insulate one portion of the rounded trace from another portion of the rounded trace that may be used in a differential pair configuration. In certain embodiments dielectric layer 41 may be a similar material to photoresist layer 10. However in other embodiments dielectric layer 41 may be a different material than photoresist layer 10.

Figure 7:
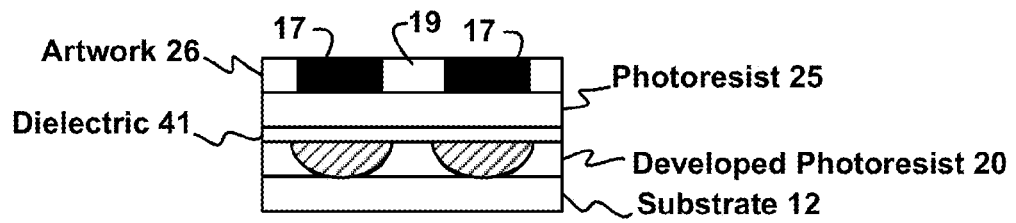

FIG. 7 depicts a cross-section of a circuit apparatus during a photoresist application and artwork registration stage according to embodiments of the present invention. During the photoresist application stage a photoresist layer 25 is applied upon, laminated, or otherwise joined to the circuit apparatus of FIG. 5. Photoresist layer 25 is sensitive to light, and in certain embodiments may be sensitive to ultraviolet light, deep ultraviolet light, the H and I lines of a mercury-vapor lamp, etc. When exposed to light those exposed sections of photoresist layer 25 become soluble or insoluble depending upon whether photoresist layer 25 is a positive tone photoresist or a negative tone photoresist. In certain embodiments photoresist layer 25 is a similar tone resist relative to photoresist layer 10. In other embodiments, photoresist layer 25 is an opposite tone resist relative to photoresist layer 10. In the first example photoresist layer 25 is an opposite tone resist relative to photoresist layer 10, or is in other words a negative tone photoresist. The height of the photoresist layer 25 is related to the desired height of the trace. More specifically, the height of the photoresist layer 25 plus half of the height of the dielectric layer 41 is approximately half the height of the desired trace.

Subsequent to the application of photoresist layer 25, artwork 26 is registered, applied upon, or otherwise joined to the photoresist layer 25. For example artwork 26 may be a glass master that is registered via fiducials and pinned in place directly over photoresist layer 25. A vacuum is optionally drawn over the glass master/photoresist layer 25 to eliminate air and ensure intimate contact. Artwork 26 has one or more adaptable-mask sections 17 and one or more continuous-mask sections 19. Adaptable-mask section 17 allows a graded, attenuated, decreasing, increasing, or otherwise user defined amount of light to pass through the adaptable-mask section 17 across the length of adaptable-mask section 17. Continuous-mask section 19 allows a similar or otherwise constant amount of light to pass through the continuous-mask section 19 across the length of section 19. Typically continuous-mask section 19 allows either all light or no light to pass through the section 19.

The density of adaptable-mask section 17 is graded, attenuated, less or more dense, or is otherwise user defined across the length of adaptable-mask section 17 to allow for a predetermined varying amount of light to pass through adaptable-mask section 17. Therefore, when the apparatus of FIG. 7 is exposed to light a predetermined varying amount of light may penetrate photoresist layer 25 creating a soluble section and insoluble section in photoresist layer 25 beneath the adaptable-mask section 17. Adaptable-mask section 17 and the soluble and insoluble photoresist sections are further described with reference to FIG. 14 below.

Depending if photoresist layer 25 is a positive tone or a negative tone photoresist, continuous-mask section 19 allows either light to completely pass through (i.e. continuous-mask section 19 is transparent or nearly transparent, etc.) or does not allow light to pass through (i.e. continuous-mask section 19 is opaque or nearly opaque, etc.). For example if photoresist layer 25 is a positive tone photoresist, continuous-mask section 19 is sufficiently opaque and blocks light from passing through to photoresist layer 25. If photoresist 25 is a negative tone photoresist, continuous-section 19 is sufficiently transparent and allows light to pass through to photoresist layer 25.

In the first example, adaptable-mask section 17 is sufficiently transparent at a first edge, gradually becomes more opaque becoming sufficiently opaque, and gradually becomes increasingly transparent becoming sufficiently transparent at a second edge. Also in the first example, continuous-section 19 is sufficiently transparent. Consequently, no light penetrates the location(s) of photoresist 25 beneath the sufficiently opaque section of adaptable-mask section 17. A graded amount of light penetrates the location(s) of photoresist 25 beneath the sufficiently transparent location(s) of adaptable-mask section 17 and all or approximately all of the light penetrates the location(s) of photoresist 25 beneath the continuous-section(s) 19.

Figure 8:
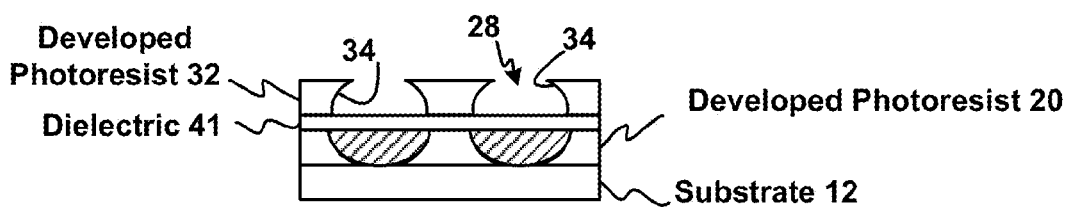

FIG. 8 depicts a cross-section of a circuit apparatus during a photoresist develop manufacturing stage according to embodiments of the present invention. The circuit apparatus of FIG. 7 is exposed to light allowing those sections of photoresist 25 beneath adaptable-section 17 and/or those sections of photoresist 25 beneath continuous-mask section 19 being exposed to light resulting in one or more soluble sections and one or more insoluble sections of photoresist layer 25. Subsequently the soluble section(s) may be removed, or otherwise developed, by a photoresist developer. After removal of the soluble section(s), photoresist layer 25 becomes developed photoresist layer 32 and the circuit apparatus of FIG. 7 becomes the circuit apparatus of FIG. 8.

Upon removal of the soluble section(s), developed photoresist layer 32 has one or more resulting geometric voids 29 used later to develop at least a portion of a trace. Within each geometric void 29 there exists an opening 28. Opening 28 is a sufficiently large opening to allow access to, for example, geometric void 24 or the dielectric layer 41 during later manufacturing steps (e.g. seeding, plating, etc.). Please note that opening 28 may in fact be quite small. Typically geometric void 29 together with geometric void 24 form generally a sidewall shape similar to the desired trace geometry.

In the first example, the geometric voids 29 take the form of one or more convex wells 34. Convex wells 34 may be elliptical, circular, or an equivalent shape used to form a rounded, arced, concave, or otherwise curved trace sidewall. In the present first example convex well 34 is the shape of the upper half of an ellipse or circle. Depending upon the desired geometry of the trace, however, there may be one or more straight segments within the arced or curved side walls. Convex wells 34 together with concave wells 22 form generally a rounded, elliptical or otherwise circular geometry.

Figure 9:
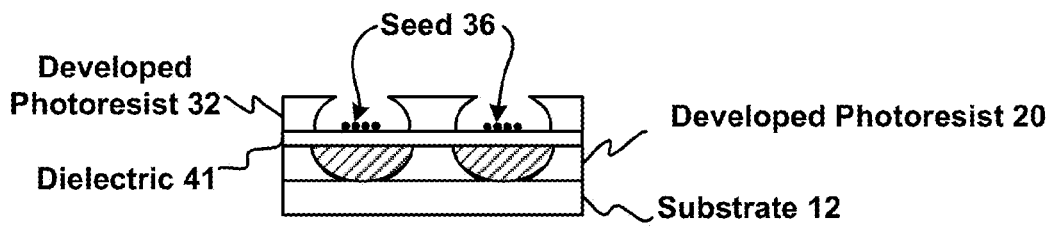

FIG. 9 depicts a cross-section of a circuit apparatus after a seed application stage according to embodiments of the present invention. During the seed application stage another electroplating seed layer 36 is applied upon the circuit apparatus of FIG. 8. More specifically, the electroplating seed layer 36 is applied upon dielectric layer 41 and within geometric void 29. The plating-seed layer may be for example photolithographically patterned or naturally adhered within, and the length of, geometric void 29, generally defining the pattern of desired conductive traces.

Figure 10:
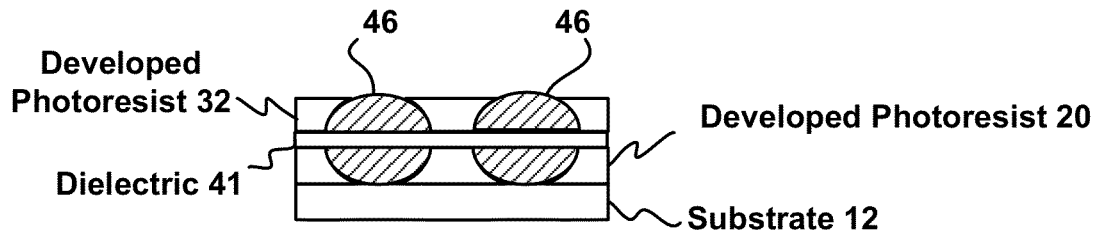

FIG. 10 depicts a cross-section of a circuit apparatus during a plating stage according to embodiments of the present invention. During the plating stage a portion 46 of a trace is developed upon the circuit apparatus of FIG. 9. The portion 46 is electrically conductive metal (e.g. gold, hard gold, copper, gold-plated copper, etc.) and generally fills geometric void 29. Portion 46 is created upon dielectric layer 41 and together with portion 40 creates the desired trace geometry.

Figure 11:
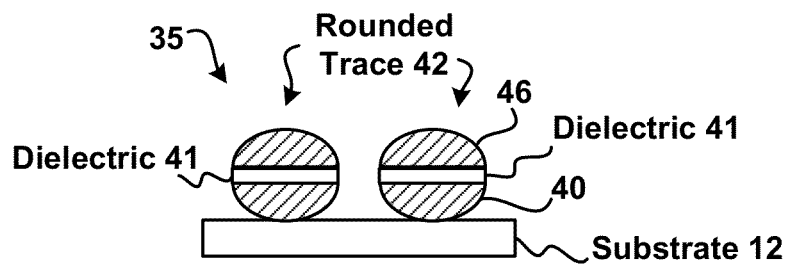

FIG. 11 depicts a circuit apparatus 35 having circular or rounded traces created after a removal manufacturing stage according to an embodiment of the present invention. After the electrically conductive traces have been formed in conformance with the mold or side walls of geometric voids 24 and 29 respectively, developed photoresist layer 20, developed photoresist 32, and portions of dielectric layer 41 are no longer required and may be stripped off using acetone or other known photoresist and/or dielectric stripping solvent (e.g. aqueous alkaline solution, etc.). The portions of dielectric layer 41 outside of the desired rounded trace geometry are those portions of dielectric layer 41 that are no longer required. The circuit apparatus of FIG. 10 may need to go through multiple removal stages to effectively remove the developed photoresist layer 20, developed photoresist 32, and those portions of dielectric layer 41. Subsequently, a circuit apparatus 35 is created having at least one electrically conductive rounded trace 42 supported by a substrate layer 12. The circuit apparatus 35 may take the form of a PCB, a flex circuit, a chip package, a silicon or other high speed interconnect, etc.

The circuit apparatus 35 may be configured as a differential pair configuration wherein each circular or rounded trace 42 is a differential pair that may be used to carry differential or semi-differential signals. In this configuration circular or rounded trace 42 may minimize crosstalk and electromagnetic interference and may allow for performance of impedance matching techniques. The surface area of circular or rounded traces 42 is relatively large and thereby is a lower-loss signal trace (i.e. insertion loss of a channel with a circular or rounded trace can be made less than a square trace of equal width/diameter, all else being held equal). The increased surface area of circular or rounded traces 42 also increases within-pair coupling of a single circular or rounded trace 42 configured as a differential pair.

Figure 12:
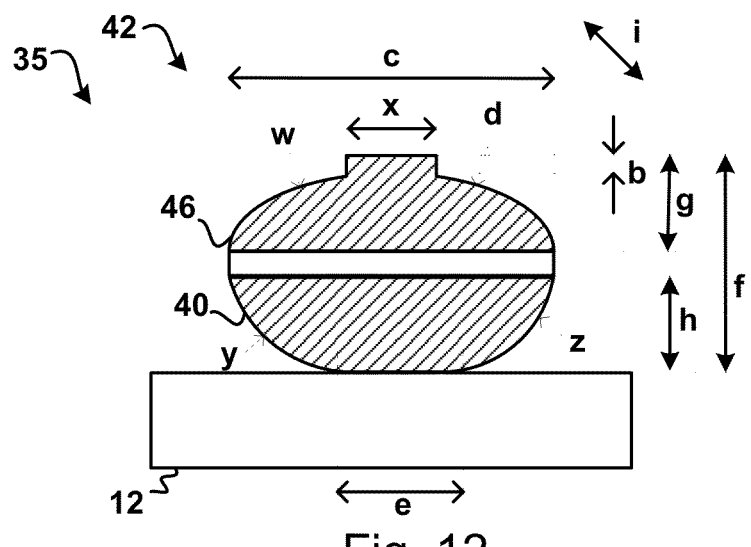
FIG. 12 depicts an exploded cross-section view of a circuit apparatus having either at least one rounded differential pair trace according to an embodiment of the present invention.

FIG. 12 depicts an exploded cross-section view of the circuit apparatus 35 having either at least one rounded trace 42, according to an embodiment of the present invention. The rounded trace 42 has a width (c), height (f), and length (i) (into the page). The lower portion 40 of the rounded trace 42 has a height (h) from substrate 12. The upper portion 46 of the rounded trace 42 has a height (g). In certain embodiments height (h) equals height (g). The lower portion has a radius (y) and a radius (z). In some embodiments radius (y) equals radius (z). The upper portion has a radius (d) and a radius (w). In some embodiments radius (d) equals radius (w).

A relatively flat surface on the lower portion 40 of the rounded trace 42 has a width (e). Width (e) corresponds to the width of exposed substrate 23. The relatively flat surface allows for the lower portion 40 to connect or otherwise adhere to substrate 12. Width (e) may be minimized to allow for a larger radius (z) or radius (y), and in some embodiments, width (e) may be approximately zero (i.e. there is little to no exposed substrate 23).

The upper portion 46 has an exposed section having a relatively flat surface of width (x) and height (b). Width (x) corresponds to the width of opening 28. Since the width of opening 28 is minimized, width (x) is also minimized. Though in FIG. 12, width (x) and height (b) appear to be relatively large, width (x) and height (b) may be small. In certain embodiments width (x) and height (b) are minimized.

Figure 13:
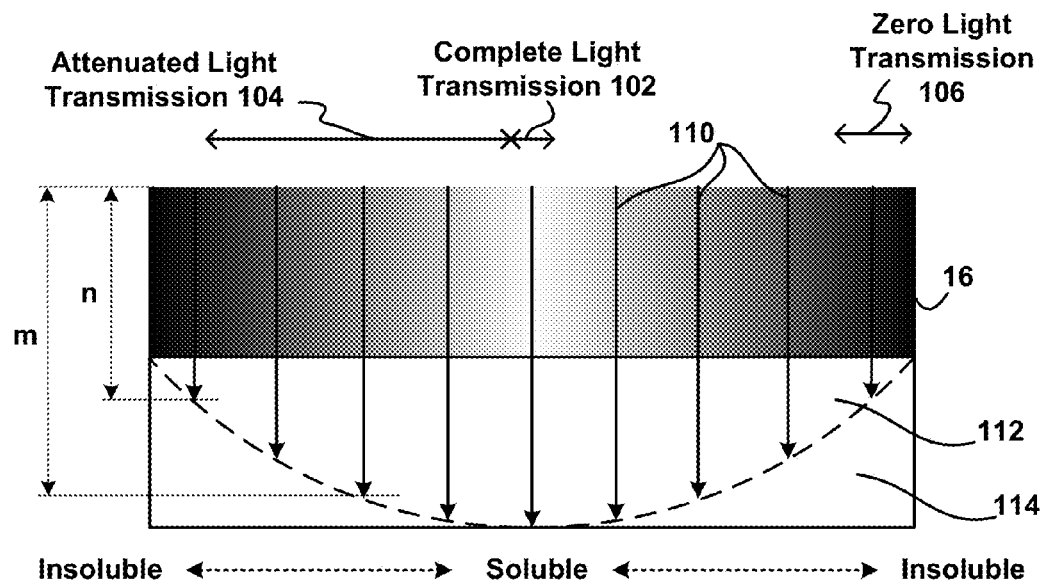
FIGS. 13 and 14 depict adaptable-mask sections that allow light to penetrate a photoresist layer at varying depths according to embodiments of the present invention.

FIG. 13 depicts adaptable-mask section 16 that allow light 110 to penetrate a photoresist layer at varying depths according to embodiments of the present invention. When exposed to light, the adaptable-mask section 16 allows for zero light transmission 106, attenuated light transmission 104, or complete light transmission 102. The portion of adaptable-mask section 16, corresponding to zero light transmission 106, is sufficiently opaque such that no light penetrates the underlying photoresist. The portion of adaptable-mask section 16, corresponding to complete light transmission 102, is sufficiently transparent such that light penetrates the entire height of the underlying photoresist. The portion of adaptable-mask section 16, corresponding to attenuated light transmission 104, allows light to increasingly gradually penetrate the underlying photoresist moving away from complete light transmission 102. Therefore light penetrates the underlying photoresist at varying depths. For instance, light may penetrate the underlying photoresist at depth m or at depth n, or more generally at depths indicated by the dashed line.

A soluble section 112 results from the variable light penetration depth across the width of the underlying resist. An insoluble section 114 is created where the light has not penetrated or has penetrated less than the height of the underlying resist. In the first example where the underlying photoresist layer is a positive resist the light penetrating depth, defining the soluble section 112 and insoluble section 114, is depicted by the dashed line.

Figure 14:
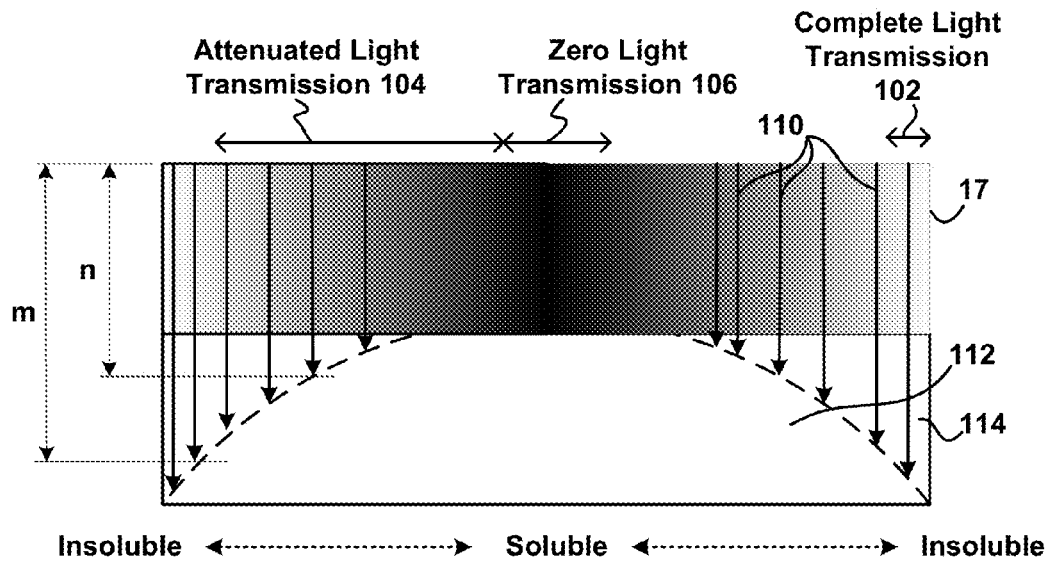

FIG. 14 depicts adaptable-mask section 17 that allow light 110 to penetrate a photoresist layer at varying depths according to embodiments of the present invention. When exposed to light, the adaptable-mask section 17 allows for zero light transmission 106, attenuated light transmission 104, or complete light transmission 102. The portion of adaptable-mask section 17, corresponding to zero light transmission 106, is sufficiently opaque such that no light penetrates the underlying photoresist. The portion of adaptable-mask section 17, corresponding to complete light transmission 102, is sufficiently transparent such that light penetrates the entire height of the underlying photoresist. The portion of adaptable-mask section 17, corresponding to attenuated light transmission 104, allows light to increasingly gradually penetrate the underlying photoresist moving away from complete light transmission 102. Therefore, light penetrates the underlying photoresist at varying depths. For instance, light may penetrate the underlying photoresist at depth m or at depth n, or more generally at depths indicated by the dashed line.

A soluble section 112 results from the variable light penetration depth across the width of the underlying resist. An insoluble section 114 is created where the light has penetrated a variable depth of the underlying resist. In the first example where the underlying photoresist layer is a negative resist the light penetrating depth, defining the soluble section 112 and insoluble section 114, is depicted by the dashed line.

Figure 15:
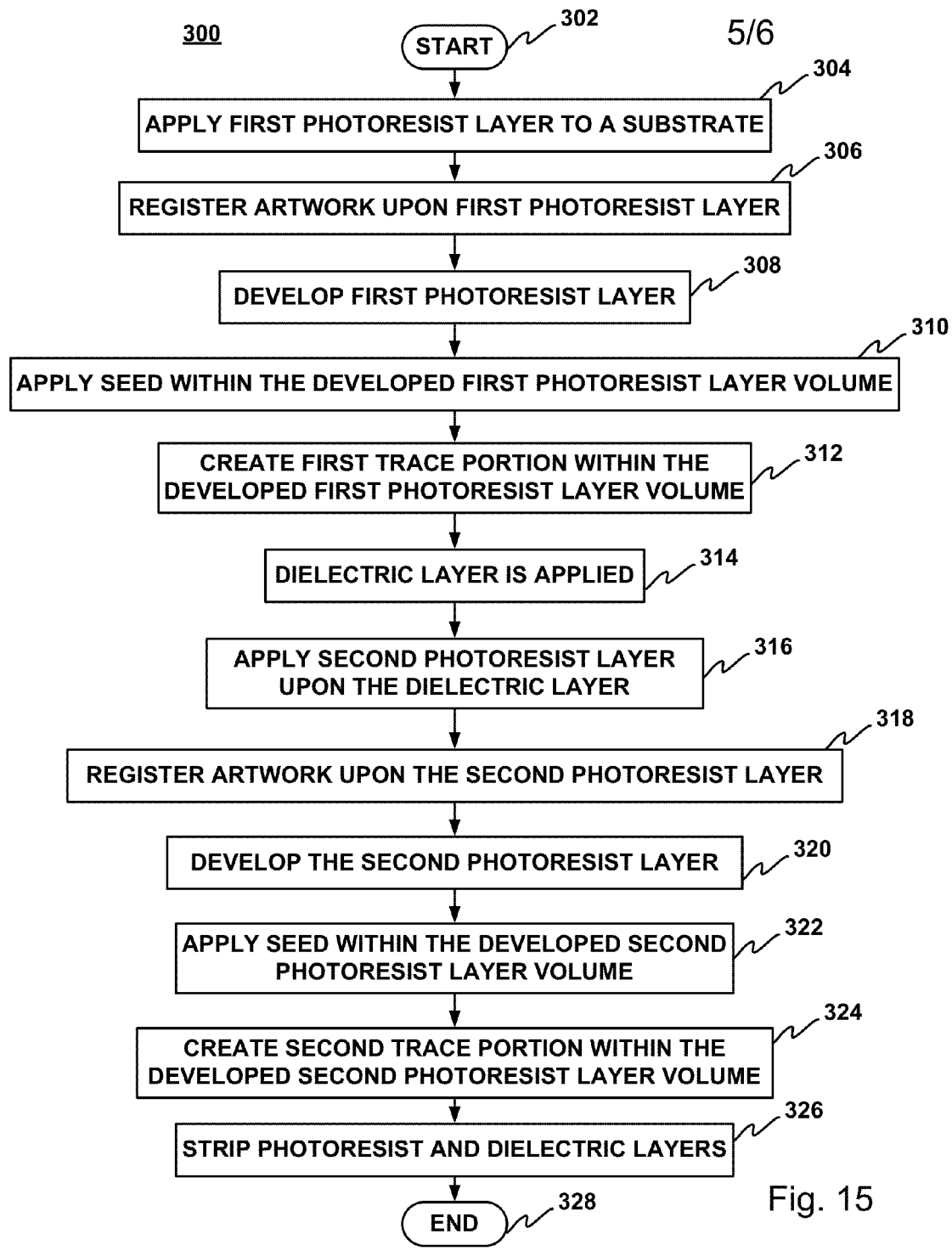
FIG. 15 depicts a method for manufacturing a circuit apparatus having at least one rounded differential pair trace thereupon according to an embodiment of the present invention.

FIG. 15 depicts a method 300 for manufacturing a circuit apparatus having at least one rounded differential pair trace thereupon according to an embodiment of the present invention. Method 300 starts at block 302. A first photoresist layer is applied, laminated, or otherwise joined to a substrate (block 304). A first artwork layer is registered upon the first photoresist layer (block 306). The first photoresist layer is developed (block 308). An electroplating seed layer is applied within the developed first photoresist layer volume (block 310). A first trace portion is created within the developed first photoresist layer volume (block 312). A dielectric layer is applied upon, laminated, or otherwise joined to the trace portion and developed first photoresist layer surface (block 314). A second photoresist layer is applied upon, laminated, or otherwise joined to the developed photoresist layer (block 316). A second artwork layer is registered upon the second photoresist layer (block 318). The second photoresist layer is developed (block 320). Another electroplating seed layer is applied within the developed second photoresist layer volume (block 322). A second trace portion is created within the developed second photoresist layer volume (block 324). The first photoresist layer, the second photoresist layer, and excess portions of the dielectric layer are stripped away (block 326). Method 300 ends at block 328.

Figure 16:
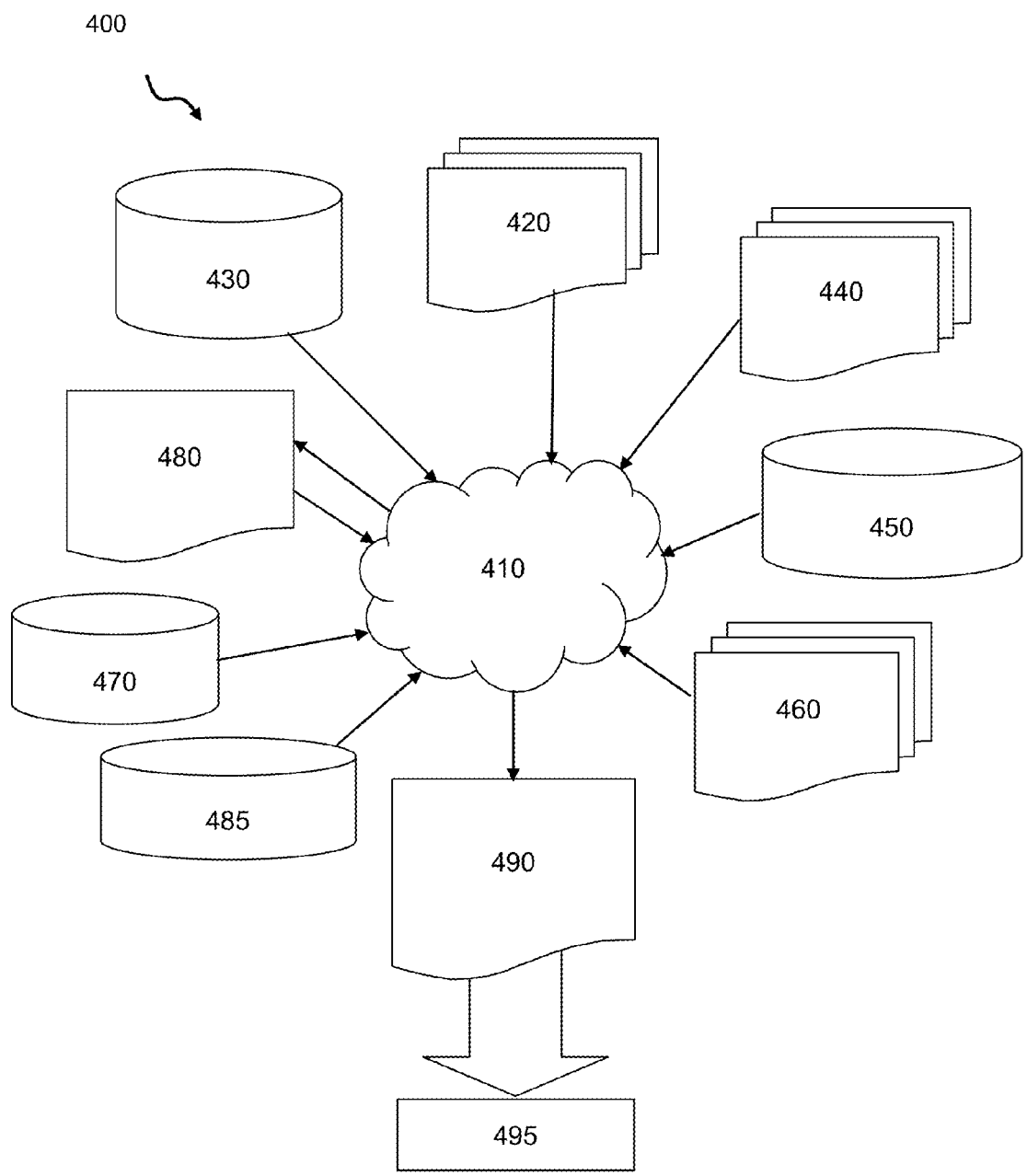
FIG. 16 depicts a flow diagram of a design process used in circuit apparatus design, manufacturing, and/or test according to an embodiment of the present invention.

FIG. 16 shows a block diagram of an exemplary design flow 400 used for example, in circuit apparatus design, simulation, test, layout, and manufacture. Design flow 400 includes processes and mechanisms for processing design structures to generate logically or otherwise functionally equivalent representations of the embodiments of the invention shown in FIGS. 1-14. The design structures processed and/or generated by design flow 400 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 16 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission or storage medium, design structure 420 may be accessed and processed by one or more hardware and/or software modules within design process 410 to simulate or otherwise functionally represent an electronic component, circuit, electronic or logic module, apparatus, device, or system such as those shown in FIGS. 1-14. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or logic structures shown in FIGS. 1-14 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology. The data structure types may further include design specifications 440, characterization data 450, verification data 460, design rules 470, and test data files 485 which may include input test patterns, output test results, and other testing information. Design process 410 may further include modules for performing standard circuit design processes such as timing analysis, verification, design rule checking, place and route operations, etc.

Design process 410 employs and incorporates well-known logic and physical design tools such as HDL compilers and simulation model build tools to process design structure 420 together with some or all of the depicted supporting data structures to generate a second design structure 490. Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 490 may comprise a compiled, executable HDL simulation model that functionally simulates the devices shown in FIGS. 1-14.

Design structure 490 may also employ a data format used for the exchange of layout data of integrated circuits and/or symbolic data format. Design structure 490 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1-14. Design structure 490 may then proceed to a stage 495 where, for example, design structure 490: proceeds to tape-out, is released to manufacturing, is released to a mask house, is sent to another design house, is sent back to the customer, etc.

It is to be understood that the present invention, in accordance with at least one present embodiment, includes a PCB, a flex circuit, a chip package, a silicon or other high speed interconnect, etc. that may be implemented in at least one electronic enclosure, such as general-purpose server running suitable software programs.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

The invention claimed is:

1. A method to manufacture a circuit apparatus having a rounded differential pair trace comprising:
   creating a first portion of a rounded electrically conductive trace having a first rounded sidewall and a first flat sidewall on a substrate;
   applying a dielectric layer upon the flat sidewall; and
   creating a second portion of the rounded electrically conductive trace having a second rounded sidewall and a second flat sidewall on the dielectric layer, the first and second portions of the rounded electrically conductive trace being aligned together.

2. The method of claim 1 wherein the first rounded sidewall and the second rounded side wall are aligned together forming a circular geometry.

3. The method of claim 1 wherein the first rounded sidewall and the second rounded side wall are aligned together forming an elliptical geometry.

4. The method of claim 1 wherein creating a first portion of a rounded electrically conductive trace having a first rounded sidewall and a first flat sidewall further comprises:
   applying a first photoresist layer to the substrate;
   registering a first artwork layer having at least one adaptable-mask section and at least one continuous-mask section upon the first photoresist layer; and
   developing the first photoresist layer creating a void in the photoresist layer.

5. The method of claim 4 wherein creating a first portion of a rounded electrically conductive trace having a first rounded sidewall and a first flat sidewall further comprises:
   applying an electroplating seed layer within a void created in the developed first photoresist layer.

6. The method of claim 5 wherein creating a first portion of a rounded electrically conductive trace having a first rounded sidewall and a first flat sidewall further comprises:
   plating an electrically conductive material within the void created in the developed first photoresist layer.

7. The method of claim 6 wherein applying a dielectric layer upon the flat sidewall further comprises:
   laminating a dielectric layer upon the developed first photoresist layer and electrically conductive plated surface.

8. The method of claim 6 wherein creating a second portion of a rounded electrically conductive trace having a second rounded sidewall and a second flat sidewall further comprises:
   applying a second photoresist layer upon the dielectric layer;
   registering a second artwork layer having at least one adaptable-mask section and at least one continuous-mask section layer upon the second photoresist layer; and
   developing the second photoresist layer.

9. The method of claim 8 wherein creating a second portion of a rounded electrically conductive trace having a second rounded sidewall and a second flat sidewall further comprises:
   applying an electroplating seed layer within a void created in the developed second photoresist layer.

10. The method of claim 9 wherein creating a second portion of a rounded electrically conductive trace having a second rounded sidewall and a second flat sidewall further comprises:
    plating an electrically conductive material within the void created in the developed second photoresist layer.

11. The method of claim 10 further comprising:
    removing the first photoresist layer;
    removing the second photoresist layer; and
    removing portions of the dielectric layer outside of the desired rounded trace geometry.

* * * * *